(12) United States Patent
King et al.

(10) Patent No.: US 7,253,604 B2
(45) Date of Patent: Aug. 7, 2007

(54) ASSEMBLED CAPACITOR POLARITY AUTOMATIC INSPECTING METHOD AND SYSTEM

(75) Inventors: Sonic King, Taipei (TW); Bg Fan, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/365,263

(22) Filed: Feb. 28, 2006

(65) Prior Publication Data

US 2007/0103142 A1  May 10, 2007

(30) Foreign Application Priority Data

Nov. 3, 2005  (TW) .............. 94138525 A

(51) Int. Cl.
G01R 19/14 (2006.01)
G01R 31/12 (2006.01)

(52) U.S. Cl. .................. 324/133; 324/548
(58) Field of Classification Search ......... 324/133
See application file for complete search history.

(56) References Cited

U.S. PATENT DOCUMENTS 4,779,040 A * 10/1988 Aldinger .............. 324/678
5,159,526 A * 10/1992 Marek ................. 361/311
5,502,375 A * 3/1996 Marek ................. 324/133
5,504,422 A * 4/1996 Bundschuh et al. ...... 324/133
6,169,395 B1 * 1/2001 King .................. 324/133
6,823,044 B2 * 11/2004 Rosner ................ 378/98.8

* cited by examiner

Primary Examiner—Andrew H. Hirshfeld
Assistant Examiner—Jeff Natalini
(74) Attorney, Agent, or Firm—Peter F. Corless; Steven M. Jensen; Edwards Angell Palmer & Dodge LLP

(57) ABSTRACT

An assembled capacitor polarity automatic inspecting method and system is proposed, which is designed for use to perform an automatic inspecting procedure to check whether an array of polarized capacitor are mounted correctly in polarity on a circuit board; and which is characterized by the use of computerized technology to automatically check whether each assembled capacitor on the circuit board is mounted correctly in polarity and automatically generate an inspection report in electronic form to show the result of inspection. This feature allows the QA/QC procedure on the circuit board not only to save labor and time but also to be much more accurate and efficient than the prior art.

6 Claims, 2 Drawing Sheets

ASSEMBLED CAPACITOR POLARITY AUTOMATIC INSPECTING METHOD AND SYSTEM

BACKGROUND OF THE INVENTION

1. Field of the Invention

This invention relates to electronic QA/QC (Quality Assurance/Quality Control) technology, and more particularly, to an assembled capacitor polarity automatic inspecting method and system which is designed for use to perform an automatic inspecting procedure on a circuit board (such as a computer motherboard) that is assembled with one or more polarized capacitors, such as DIP (Dual Inline Package) capacitors, for the purpose of checking whether the polarized capacitors are mounted correctly in polarity on the circuit board.

2. Description of Related Art

In the manufacture of computer motherboards, it is a standard procedure to mount an array of DIP (Dual Inline Package) capacitors on the motherboards. Since DIP capacitors are polarized capacitors having a positive connecting end and a negative connecting end, it is important to assure that each DIP capacitor is mounted correctly in polarity on the motherboards. If a DIP capacitor is mounted incorrectly in polarity, it will not be able to provide the intended electrical operation and thus make the circuitry on the motherboard unable to operate normally. For this sake, after a motherboard is assembled, it is a necessary step in the QA/QC (Quality Assurance/Quality Control) procedure to check whether each assembled DIP capacitor on the motherboard is correctly mounted in polarity.

A conventional method for checking DIP capacitor polarity on the motherboard is to visually inspect each mounted DIP capacitor by the QA/QC engineers to see if each DIP capacitor is mounted correctly in polarity. If any DIP polarity is found to be incorrectly mounted in polarity, the QA/QC engineer will mark it on a checklist and then submit the checklist to the assembly works for correction. One drawback to this practice, however, is that the visual checking method by human labor is not only quite tedious and time-consuming, but cannot assure that all of the incorrectly-mounted DIP capacitors can be picked out. This conventional practice is therefore quite inefficient and inaccurate.

SUMMARY OF THE INVENTION

It is therefore an objective of this invention to provide an assembled capacitor polarity automatic inspecting method and system which is capable of performing an automatic inspecting procedure on assembled DIP capacitors on a computer motherboard in a more efficient and effortless manner than the prior art.

It is another objective of this invention to provide an assembled capacitor polarity automatic inspecting method and system which is more accurate than the prior art such that it can be more assured that all of the incorrectly-mounted DIP capacitors can be picked out.

The assembled capacitor polarity automatic inspecting method and system according to the invention is designed for use to perform an automatic inspecting procedure on a circuit board (such as a computer motherboard) that is assembled with one or more polarized capacitors, such as DIP capacitors, for the purpose of checking whether the polarized capacitors are mounted correctly in polarity on the circuit board.

The assembled capacitor polarity automatic inspecting method comprises: (1) generating a testing signal and transferring the generated testing signal to the polarized capacitor; (2) detecting a responding signal from the polarized capacitor in response to the testing signal; (3) verifying whether the responding signal from the polarized capacitor matches to an expected signal response from the polarized capacitor under the condition of being correctly mounted in polarity; if YES, issuing a polarity-correct message; and if NO, issuing a polarity-incorrect message; and (4) generating an inspection report in electronic form based on the polarity correct/incorrect message.

In architecture, the assembled capacitor polarity automatic inspecting system comprises: (A) a testing signal generating module, which is capable of generating a testing signal and transferring the generated testing signal to the polarized capacitor; (B) a response detecting module, which is capable of detecting a responding signal from the polarized capacitor in response to the testing signal from the testing signal generating module; (C) a responding signal verification module, which is capable of verifying whether the responding signal detected by the response detecting module from the polarized capacitor matches to an expected signal response from the polarized capacitor under the condition of being correctly mounted in polarity; if YES, capable of issuing a polarity-correct message; and if NO, capable of issuing a polarity-incorrect message; and (D) an inspection report generating module, which is capable of generating an inspection report in electronic form based on the polarity correct/incorrect message supplied by the responding signal verification module.

The assembled capacitor polarity automatic inspecting method and system according to the invention is characterized by the use of computerized technology to automatically check whether each assembled capacitor on the circuit board is mounted correctly in polarity and automatically generate an inspection report in electronic form to show the result of inspection. This feature allows the QA/QC procedure on the circuit board not only to save labor and time but also to be much more accurate and efficient than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The assembled capacitor polarity automatic inspecting method and system according to the invention is disclosed in full details by way of preferred embodiments in the following with reference to the accompanying drawings.

Figure 1:
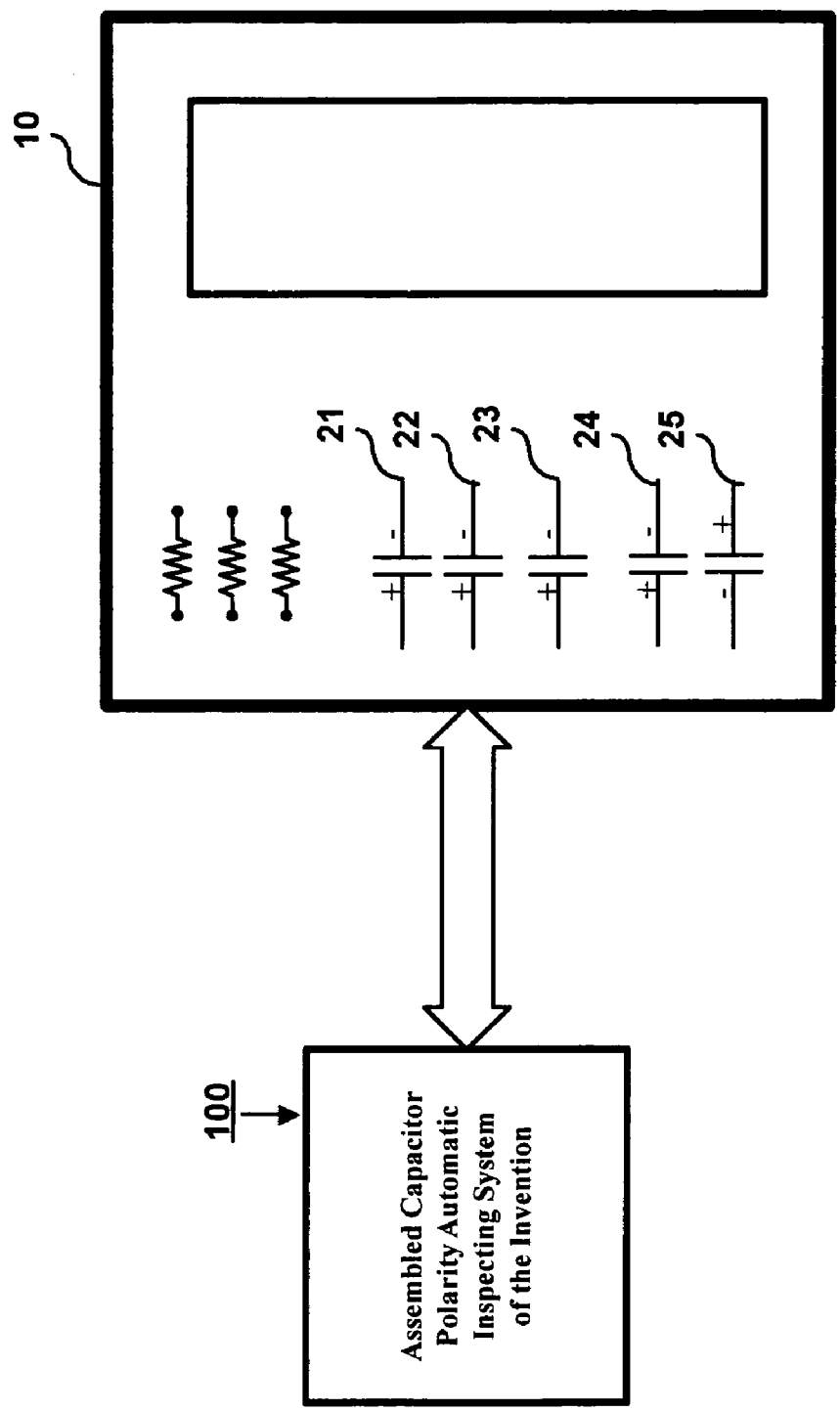
FIG. 1 is a schematic diagram showing the application of the assembled capacitor polarity automatic inspecting system of the invention.
Figure 2:
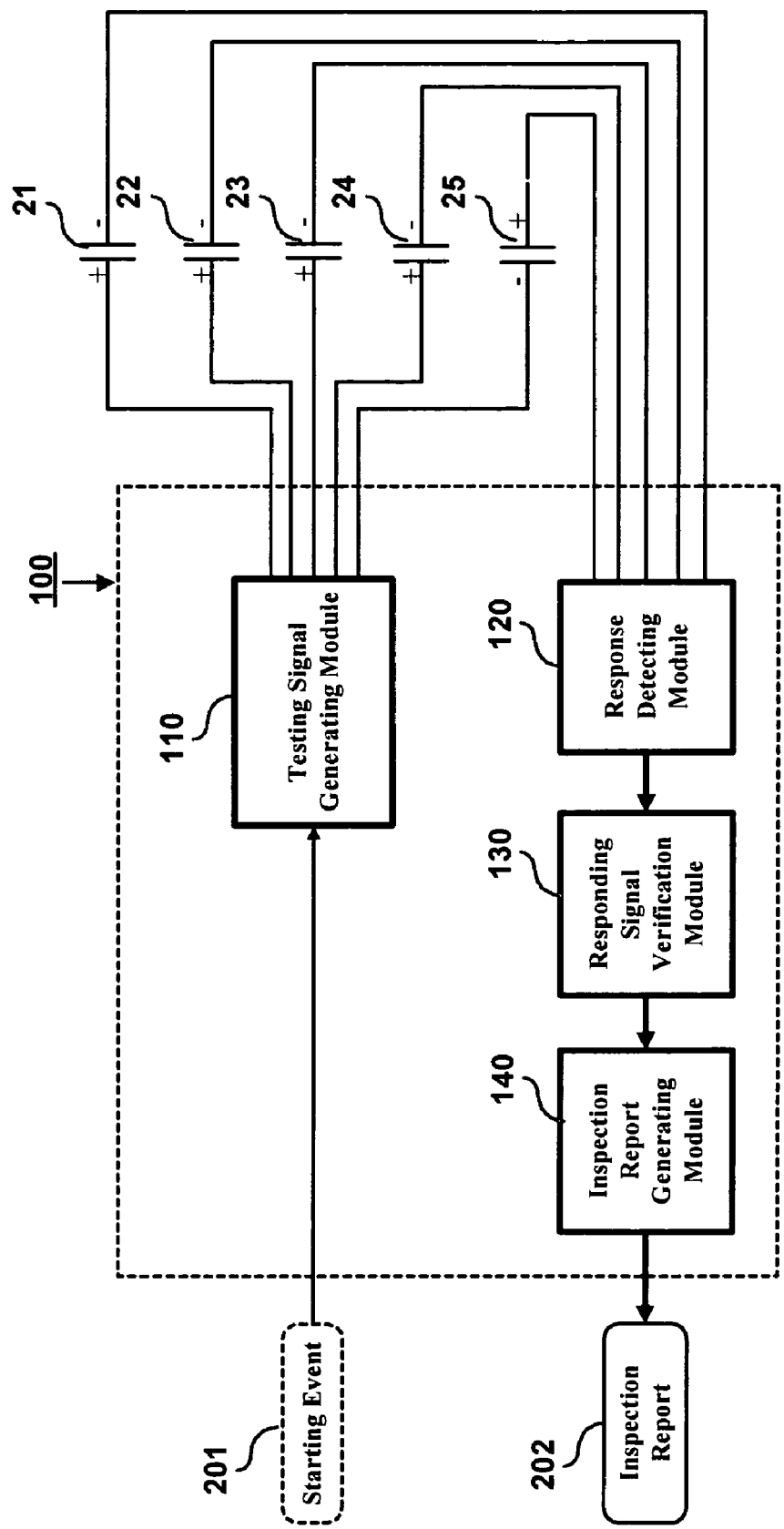
FIG. 2 is a schematic diagram showing the architecture of the assembled capacitor polarity automatic inspecting system of the invention.

FIG. 1 is a schematic diagram showing the application of the assembled capacitor polarity automatic inspecting system according to the invention (as the block indicated by the reference numeral 100). As shown, the assembled capacitor polarity automatic inspecting system of the invention 100 is designed for use to perform an automatic inspecting procedure on a circuit board (such as a computer motherboard 10) that is assembled with one or more polarized capacitors, such as an array of DIP (Dual Inline Package) capacitors 21, 22, 23, 24, 25, during the QA/QC procedure of the computer motherboard 10, for the purpose of checking whether the DIP capacitors 21, 22, 23, 24, 25 are mounted correctly in polarity (note that FIG. 1 and FIG. 2 are only schematic diagrams intended for demonstrative purposes, showing only those circuit elements that are related to the invention; in practical applications, the number of the DIP capacitors on the computer motherboard 10 is not limited to 5 and can be an arbitrary design choice, and the circuit layout on the computer motherboard 10 can be more complex). In the example of FIG. 1, it is assumed that among the 5 DIP capacitors 21, 22, 23, 24, 25, the first four DIP capacitors 21, 22, 23, 24, are mounted correctly in polarity, whereas the last DIP capacitor 25 is mounted incorrectly in polarity.

As shown in FIG. 2, in architecture, the assembled capacitor polarity automatic inspecting system of the invention 100 comprises: (A) a testing signal generating module 110; (B) a response detecting module 120; (C) a responding signal verification module 130; and (D) an inspection report generating module 140. Firstly, the respective attributes and behaviors of the constituent modules 110, 120, 130, 140 of the assembled capacitor polarity automatic inspecting system of the invention 100 are described in details in the following.

The testing signal generating module 110 is designed to respond to a starting event 201 (i.e., an event of the user starting the assembled capacitor polarity automatic inspecting system of the invention 100) by generating a set of testing signals and then transferring the generated testing signals to the DIP capacitors 21, 22, 23, 24, 25. In practical implementation, for example, the testing signals are each a square pulse which can be used to test whether the DIP capacitors 21, 22, 23, 24, 25 can respond to this square pulse correctly.

The response detecting module 120 is designed to detect a responding signal from each of the DIP capacitors 21, 22, 23, 24, 25 in response to the testing signals from the testing signal generating module 110. If the testing signals are square pulse signals, each polarity-correct DIP capacitor (i.e., 21, 22, 23, 24) will be charged by the square pulse signal and as a result set to a logic-HIGH voltage state (i.e., charged state), and whereas each polarity-incorrect DIP capacitor (i.e., 25) will be uncharged by the square pulse signal and thus remain in a logic-LOW voltage state (i.e., uncharged state).

The responding signal verification module 130 is capable of verifying whether the responding signal detected by the response detecting module 120 from the DIP capacitors 21, 22, 23, 24, 25 matches to an expected signal response from these DIP capacitors 21, 22, 23, 24, 25 capacitor under the condition of being correctly mounted in polarity. As mentioned above, the response from each polarity-correct DIP capacitor is a logic-HIGH voltage state (charged state), and that from each polarity-incorrect DIP capacitor is a logic-LOW voltage state (uncharged state). Accordingly, by checking the voltage state of each of the DIP capacitors 21, 22, 23, 24, 25, the responding signal verification module 130 is able to determine whether each of the DIP capacitors 21, 22, 23, 24, 25 is correctly mounted in polarity. For each of the polarity-correct DIP capacitors (i.e., 21, 22, 23, 24), the responding signal verification module 130 will issue a polarity-correct message to the inspection report generating module 140; and whereas for the polarity-incorrect DIP capacitor 25, the responding signal verification module 130 will issue a polarity-incorrect message to the inspection report generating module 140.

The inspection report generating module 140 is designed to generate an inspection report 202 in electronic form based on the polarity correct/incorrect messages supplied by the responding signal verification module 130. In practical implementation, for example, the inspection report 202 is displayed on a monitor screen (not shown) and can be either in text format or in graphic format to show which of the DIP capacitors 21, 22, 23, 24, 25 are correctly assembled in polarity and which are not.

The following is a detailed description of a practical example of the application of the assembled capacitor polarity automatic inspecting system of the invention 100 during actual operation. In this application example, it is assumed that among the 5 DIP capacitors 21, 22, 23, 24, 25, the first four DIP capacitors 21, 22, 23, 24, are mounted correctly in polarity, whereas the last DIP capacitor 25 is mounted incorrectly in polarity.

Referring to FIG. 1 together with FIG. 2, In practical application, after a computer motherboard 10 is assembled, a QA/QC procedure is performed on the computer motherboard 10 by using the assembled capacitor polarity automatic inspecting system of the invention 100. When the QA/QC engineer starts the assembled capacitor polarity automatic inspecting system of the invention 100 (i.e., initiating a starting event 201), the testing signal generating module 110 is first activated to generate a set of testing signals, such as a set of square pulses, and then transferring the generated testing signals to the DIP capacitors 21, 22, 23, 24, 25.

When the DIP capacitors 21, 22, 23, 24, 25 receive the testing signals, each polarity-correct DIP capacitors (i.e., 21, 22, 23, 24) will be charged by the testing signal and thus set to a logic-HIGH voltage state (i.e., charged state), and whereas the polarity-incorrect DIP capacitor 25 will be incapable of being charged by the testing signal and thus remains in a logic-LOW voltage state (i.e., uncharged state). The response detecting module 120 can detect the respective voltage states of the DIP capacitors 21, 22, 23, 24, 25 and then activates the responding signal verification module 130 to verify whether the responses from the DIP capacitors 21, 22, 23, 24, 25 matches to an expected signal response from these DIP capacitors 21, 22, 23, 24, 25 under the condition of being correctly mounted in polarity. If YES, the responding signal verification module 130 will issue a polarity-correct message to the inspection report generating module 140; and whereas if NO, the responding signal verification module 130 will issue a polarity-incorrect message to the inspection report generating module 140.

In response to the polarity correct/incorrect messages from the responding signal verification module 130, the inspection report generating module 140 is activated to generate an inspection report 202 in electronic form, where the inspection report 202 can be displayed on a monitor screen (not shown) for the QA/QC engineer to view the inspection result. The displayed inspection report 202 can be either presented in text format or in graphic format to show which of the DIP capacitors 21, 22, 23, 24, 25 are correctly mounted in polarity and which are not. In this example, since the first 4 DIP capacitors 21, 22, 23, 24 are mounted correctly in polarity and only the last DIP capacitor 25 is incorrectly mounted, the inspection report 202 can be devised in such a manner as to show 5 graphic icons of DIP capacitors representing the DIP capacitors 21, 22, 23, 24, 25 being inspected, and indicate by a special mark that the fifth DIP capacitor 25 is mounted incorrectly in polarity. Based on this inspection report 202, the QA/QC engineer can then requests the assembling workers to remount the polarity-incorrect DIP capacitor 25.

In conclusion, the invention provides an assembled capacitor polarity automatic inspecting method and system for use to perform an automatic inspecting procedure to check the polarity of an array of capacitors on a circuit board; and which is characterized by the use of computerized technology to automatically check whether each assembled capacitor on the circuit board is mounted correctly in polarity and automatically generate an inspection report in electronic form to show the result of inspection. This feature allows the QA/QC procedure on the circuit board not only to save labor and time but also to be much more accurate and efficient than the prior art. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An assembled capacitor polarity automatic inspecting method for use to perform an automatic inspecting procedure on a circuit board that is assembled with at least one polarized capacitor for the purpose of checking whether the polarized capacitor is mounted correctly in polarity on the circuit board, the assembled capacitor polarity automatic inspecting method comprising:

generating a pulse signal and transferring the generated pulse signal to one end of the polarized capacitor;

detecting a logic signal directly from the other end of the polarized capacitor in response to the pulse signal;

verifying whether the logic signal from the polarized capacitor matches to an expected signal response from the polarized capacitor under the condition of being correctly mounted in polarity; if YES, issuing a polarity-correct message; and if NO, issuing a polarity-incorrect message; and generating an inspection report in electronic form based on the polarity correct/incorrect message.

2. The assembled capacitor polarity automatic inspecting method of claim 1, wherein the circuit board is a computer motherboard.

3. The assembled capacitor polarity automatic inspecting method of claim 1, wherein the polarized capacitor is a DIP (Dual Inline Package) capacitor.

4. An assembled capacitor polarity automatic inspecting system for use to perform an automatic inspecting procedure on a circuit board that is assembled with at least one polarized capacitor for the purpose of checking whether the polarized capacitor is mounted correctly in polarity on the circuit board, the assembled capacitor polarity automatic inspecting system comprising:

a testing signal generating module, which is configured to be connected to one end of the polarized capacitor and capable of generating a pulse signal and transferring the generated pulse signal to the one end of the polarized capacitor;

a response detecting module, which is configured to be connected to the other end of the polarized capacitor and capable of detecting a logic signal from the other end of the polarized capacitor in response to the pulse signal from the testing signal generating module;

a responding signal verification module, which is capable of verifying whether the logic signal detected by the response detecting module from the polarized capacitor matches to an expected signal response from the polarized capacitor under the condition of being correctly mounted in polarity; if YES, capable of issuing a polarity-correct message; and if NO, capable of issuing a polarity-incorrect message; and an inspection report generating module, which is capable of generating an inspection report in electronic form based on the polarity correct/incorrect message supplied by the responding signal verification module.

5. The assembled capacitor polarity automatic inspecting system of claim 4, wherein the circuit board is a computer motherboard.

6. The assembled capacitor polarity automatic inspecting system of claim 4, wherein the polarized capacitor is a DIP (Dual Inline Package) capacitor.

* * * * *